United States Patent
Tosh et al.

(10) Patent No.: US 9,959,995 B2
(45) Date of Patent: *May 1, 2018

(54) KEYBOARD BACKLIGHT SYSTEM

(71) Applicant: Dell Products, LP, Round Rock, TX (US)

(72) Inventors: Andrew P. Tosh, Cedar Park, TX (US); Deeder M. Aurongzeb, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/052,440

(22) Filed: Feb. 24, 2016

(65) Prior Publication Data
US 2016/0172131 A1    Jun. 16, 2016

Related U.S. Application Data

(63) Continuation of application No. 14/449,655, filed on Aug. 1, 2014, now Pat. No. 9,305,722.

(51) Int. Cl.
*H01H 13/83* (2006.01)
*H03K 17/96* (2006.01)
*H01H 13/02* (2006.01)
*H05B 33/08* (2006.01)

(52) U.S. Cl.
CPC .......... *H01H 13/83* (2013.01); *H01H 13/023* (2013.01); *H03K 17/9622* (2013.01); *H05B 33/0896* (2013.01); *H01H 2219/037* (2013.01); *H01H 2219/06* (2013.01); *H01H 2219/062* (2013.01); *H03K 2217/9655* (2013.01);

(Continued)

(58) Field of Classification Search
CPC ................. H01H 13/83; H01H 13/023; H01H 2219/037; H01H 2219/06; H01H 2219/062; H05B 33/0896; H03K 17/9622; H03K 2217/960755; H03K 2217/9655; H03K 2217/9656
See application file for complete search history.

(56) References Cited

U.S. PATENT DOCUMENTS

| | | | |
|---|---|---|---|
| 7,856,214 B2 | 12/2010 | Rapisarda | |
| 8,451,146 B2 * | 5/2013 | Mahowald | H01H 13/88 200/341 |
| 8,508,218 B2 | 8/2013 | Reymond et al. | |

(Continued)

OTHER PUBLICATIONS

"Apple shows interest in individually lit, multi-color keyboard backlights," Neil Hughes, Apple Insider, Dec. 2, 2010, 3 pgs http://appleinsider.com/articles/10/12/02/apple_shows_interest_in_individual-ly_lit_multi_color_keyboard_backlights.html.

(Continued)

*Primary Examiner* — Mary Ellen Bowman
(74) *Attorney, Agent, or Firm* — Prol Intellectual Property Law, PLLC; H. Kenneth Prol

(57) ABSTRACT

Disclosed systems provide keyboard backlighting from organic light emitting diodes (OLEDs) placed under the keys. A keyboard stack optionally includes a light guide or reflector. A single OLED can illuminate multiple keys through a light guide. OLEDs used for backlighting may be arranged in a strip to illuminate more than one key. OLEDs can be deposited directly to the light guide or reflector, and can include a seal to promote air stability.

20 Claims, 6 Drawing Sheets

(52) U.S. Cl.
CPC .............. *H03K 2217/9656* (2013.01); *H03K 2217/960755* (2013.01)

(56) References Cited

U.S. PATENT DOCUMENTS

| | | | | |
|---|---|---|---|---|
| 8,915,633 | B2* | 12/2014 | Pance | H05B 37/02 362/600 |
| 9,086,733 | B2* | 7/2015 | Pance | G06F 3/0202 |
| 2001/0048379 | A1* | 12/2001 | Kaikuranta | G06F 3/0202 341/22 |
| 2006/0177212 | A1* | 8/2006 | Lamborghini | B60K 37/06 396/287 |
| 2010/0328935 | A1* | 12/2010 | Pance | F21S 10/005 362/231 |
| 2011/0095702 | A1* | 4/2011 | Lee | H01L 27/3202 315/294 |
| 2012/0113013 | A1* | 5/2012 | Lee | G06F 3/0202 345/170 |

OTHER PUBLICATIONS

"OLEDs adapted as 'ultrathin' large area backlights—German partners BMG MIS and Fraunhofer COMEDD present first results of the project So-Light," Matthew Peach, Optics.org, SPIE Events Europe, Ltd, Oct. 4, 2012, 2 pgs. http://optics.org/news/3/9/39.

\* cited by examiner

KEYBOARD BACKLIGHT SYSTEM

CROSS REFERENCE TO RELATED APPLICATIONS

This application is a continuation of prior application Ser. No. 14/449,655, filed Aug. 1, 2014, entitled "Keyboard Backlight System," invented by Andrew P. Tosh et al., the disclosures of which are hereby expressly incorporated by reference in their entirety.

FIELD OF THE DISCLOSURE

The present disclosure generally relates to input devices for information handling systems, and more particularly to a keyboard backlight system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. An information handling system may include a keyboard that receives user input.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

DETAILED DESCRIPTION

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings. The use of the same reference symbols in different drawings indicates similar or identical items.

Information handling systems include keyboards for receiving user input. Keyboards are made of components arranged vertically in a keyboard stack. A keyboard stack may include components for receiving mechanical input from a user (e.g., a finger press) and converting the mechanical input into electrical signals. Such a keyboard may include a series of switches or transducers for receiving the input. The switches or transducers can include mechanical or capacitive elements for detecting the input.

For low-light conditions, disclosed systems include a backlight system. The backlight system shows light through a portion of the keys. As the light source for such backlight systems, OLEDs are placed under the keys. The OLEDs can be applied directly to a substrate under the keys. Placing OLEDs directly under the keys in some cases obviates the need for a light guide, which can result in a shorter keyboard stack. In other cases, a light guide can be used to direct light from one OLED to a group of keys. Fewer OLEDs to light a keyboard require less energy consumption. Multiple light guides can be configured to minimize the effects of losses caused by the light guides, and to minimize the added thickness caused by the light guides. OLEDs can be substantially transparent and multiple layers of OLEDs can be used to achieve multiple colors of keyboard backlighting. OLEDs can be deposited (e.g., screen printed) directly to a light guide or other substrate such as a reflector.

Figure 1:
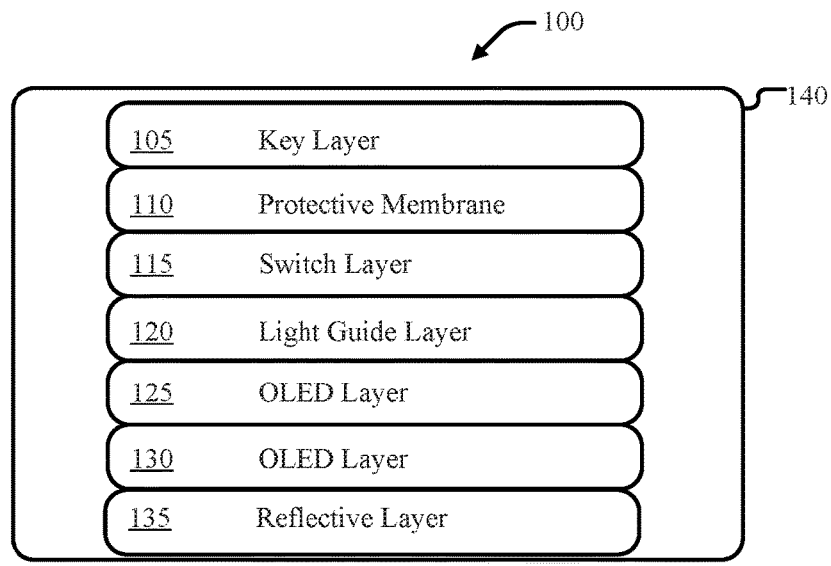
FIG. 1 illustrates aspects of a keyboard stack for providing input to an information handling system including a keyboard backlight system according to an embodiment of the present disclosure.

Exemplary systems are described with reference to the Figures. As shown, FIG. 1 illustrates aspects of a keyboard stack assembly 100 that makes up a keyboard for an information handling system. Systems represented in FIG. 1 use OLEDs as the source of backlighting. The keyboard stack assembly 100 includes chassis 140 and key layer 105. Chassis 140 can be a laptop chassis, mobile phone chassis, or enclosure for a wireless keyboard, as examples. Key layer 105 includes individual keys (e.g., "Tab" key, "Shift" key, letter "a" key, "Enter" key, and so on) that receive user input.

Keyboard stack assembly 100 includes a backlight system made of layers including OLED layer 125. Keys in key layer 105 are backlit with substantially white light from OLED layer 125 when the layer is selectively energized by a controller or processing unit (not shown). For example, a controller turns the layer on in certain circumstances such as detecting input, detecting a user, detecting low light conditions, in response to a computer program, etc. Additional elements depicted in keyboard stack assembly 100, which are present in some embodiments in various configurations, include OLED layer 130, reflective layer 135, and light guide layer 120. In some embodiments, light guide layer 120 directs light from OLED layer 125 to individual keys or to groups of keys in key layer 105. Light guide layer 120 additionally provides a surface on which to print OLED layer 125 in some embodiments.

OLED layer 130 provides a secondary source of backlighting for key layer 105. OLED layer 130 when energized emanates colored light such as green, blue, or red light. OLED layer 130 may be screen printed to reflective layer 135 or light guide layer 120. Alternate embodiments derived from the system depicted in FIG. 1 include but are not limited to a keyboard stack assembly 100 that excludes any combination of protective membrane 110, light guide layer 120, reflective layer 135, or OLED layer 130.

Protective membrane 110 protects the lower layers and may be formed of rubber or synthetic material. In some embodiments, protective membrane 110 includes synthetic material such as rubber or plastic infused with carbon fiber. Key layer 105 includes multiple keys for receiving mechanical or capacitive input through keystrokes.

Figure 2:
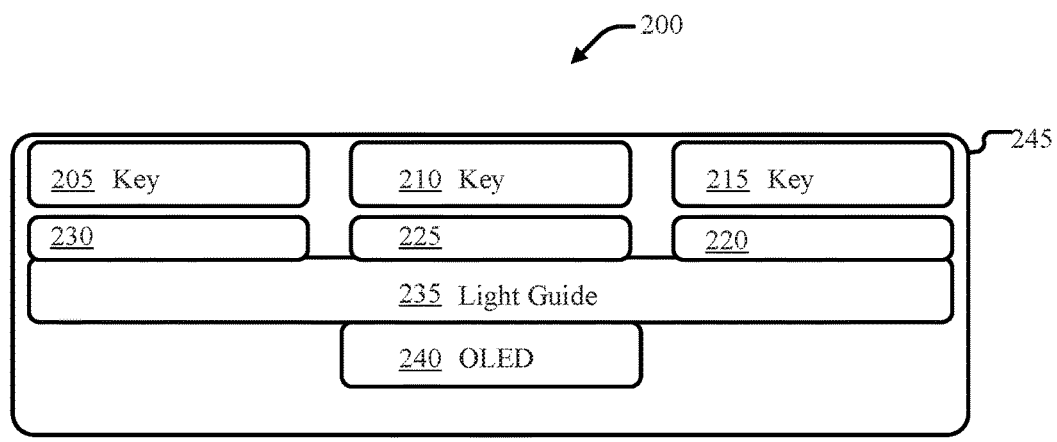
FIG. 2 illustrates aspects of a keyboard backlight system including an organic light emitting diode (OLED) and light guide for illuminating a set of keys according to an embodiment of the present disclosure.

FIG. 2 illustrates additional aspects of some embodied keyboard backlight systems. Backlight system 200 includes enclosure 245 which may be machined of aluminum or plastic, as examples. OLED 240, as shown, has been screen printed to light guide 235. OLED 240 is selectively energized to emit light. In some embodiments, the light is substantially white. Light guide 235 directs the light through diffusers 230, 225, and 220 to keys 205, 210, and 215. Diffusers 230, 225, and 220 may be openings in an otherwise reflective film that forms part of light guide 235, to allow light to escape from light guide 235 under keys 205, 210, and 215. The arrangement of backlight system 200, which represents one OLED providing light to multiple keys by way of a light guide, is used in some embodiments.

Figure 3:
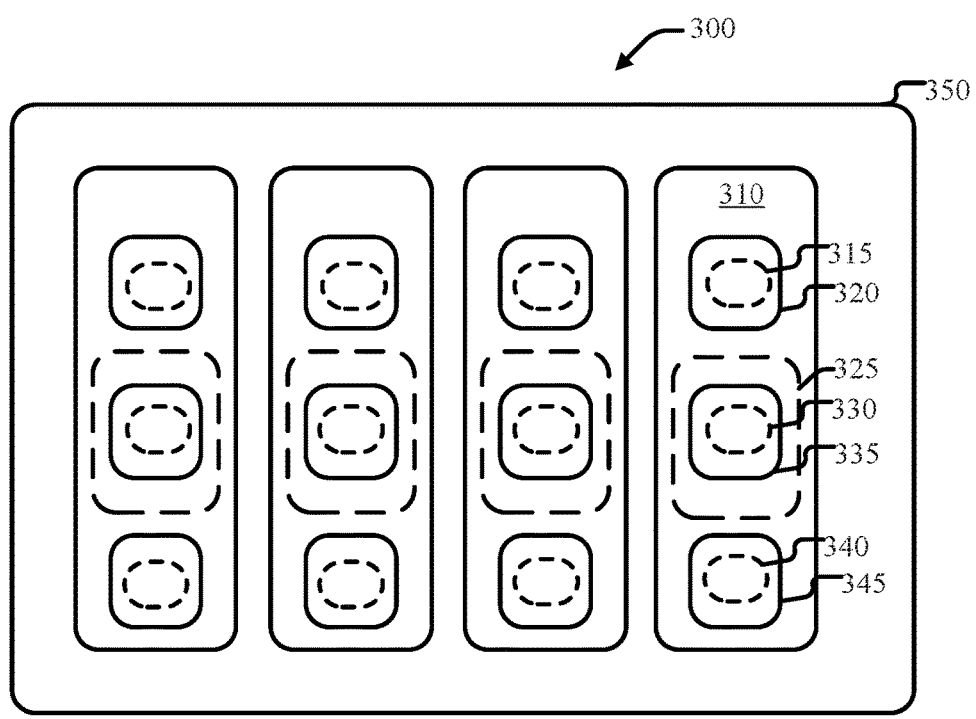
FIG. 3 illustrates a top view of a keyboard backlight system including an organic light emitting diode and light guide with openings for illuminating a set of keys according to an embodiment of the present disclosure.

FIG. 3 illustrates a top view of a keyboard backlight system 300. Backlight system 300 includes components identical to or similar to those in backlight system 200 (FIG. 2). OLED strip 325 is printed to (and located under) light guide 310, which includes openings 315, 330, and 340 to provide backlighting for keys 320, 335, and 345. Enclosure 350, as shown, includes other similar components in which a single OLED strip illuminates multiple keys from below.

Figure 4:
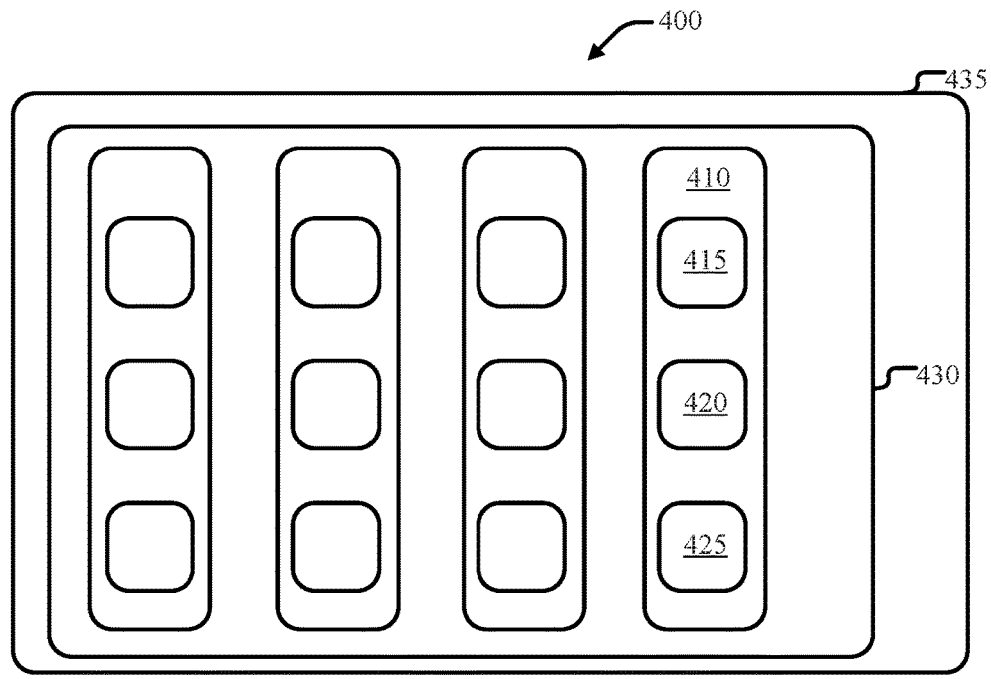
FIG. 4 illustrates a top view of a keyboard backlight system including a reflector and an OLED element for illuminating a set of keys.

FIG. 4 illustrates a top view of keyboard backlight system 400 that includes an enclosure 435 and reflector 430. OLED strip 410 is screen printed to (and located above) reflector 430. OLED strip 410 is selectively energized to provide backlighting to keys 415, 420, and 425. Some light emanating from OLED strip 410 bounces off reflector 430 toward keys 415, 420, and 425. Keys 415, 420, and 425 in some embodiments have transparent or translucent openings (e.g., in the shape of letters or numbers) that allow light from OLED strip 410 to pass through the keys to result in backlighting.

Figure 5:
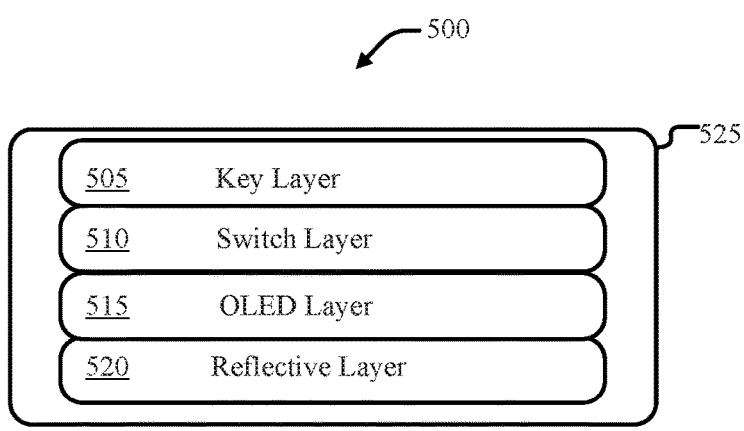
FIG. 5 illustrates a side view depicting elements of a keyboard stack including a keyboard backlight system according to embodiment of the present disclosure.

FIG. 5 illustrates a side view of keyboard stack system 500 that includes enclosure 525 and key layer 505. Key layer 505 includes a keyboard for an information handling system such as a laptop computer. OLED layer 515 is screen printed to reflective layer 520 and provides backlighting to key layer 505. Switch layer 510 produces electrical signals when keys in the key layer 505 are pressed. Reflective layer 520 may be made of any reflective material such as a retro-reflective coating or tape. Reflective layer 520 may include a metallic sheet, foil, paint, or coating (e.g., thin silver coating). Keyboard stack system 500 can be made relatively thin compared to a system with a light guide. As a result, enclosure 525 can be made thin while still providing keyboard backlighting.

Figure 6:
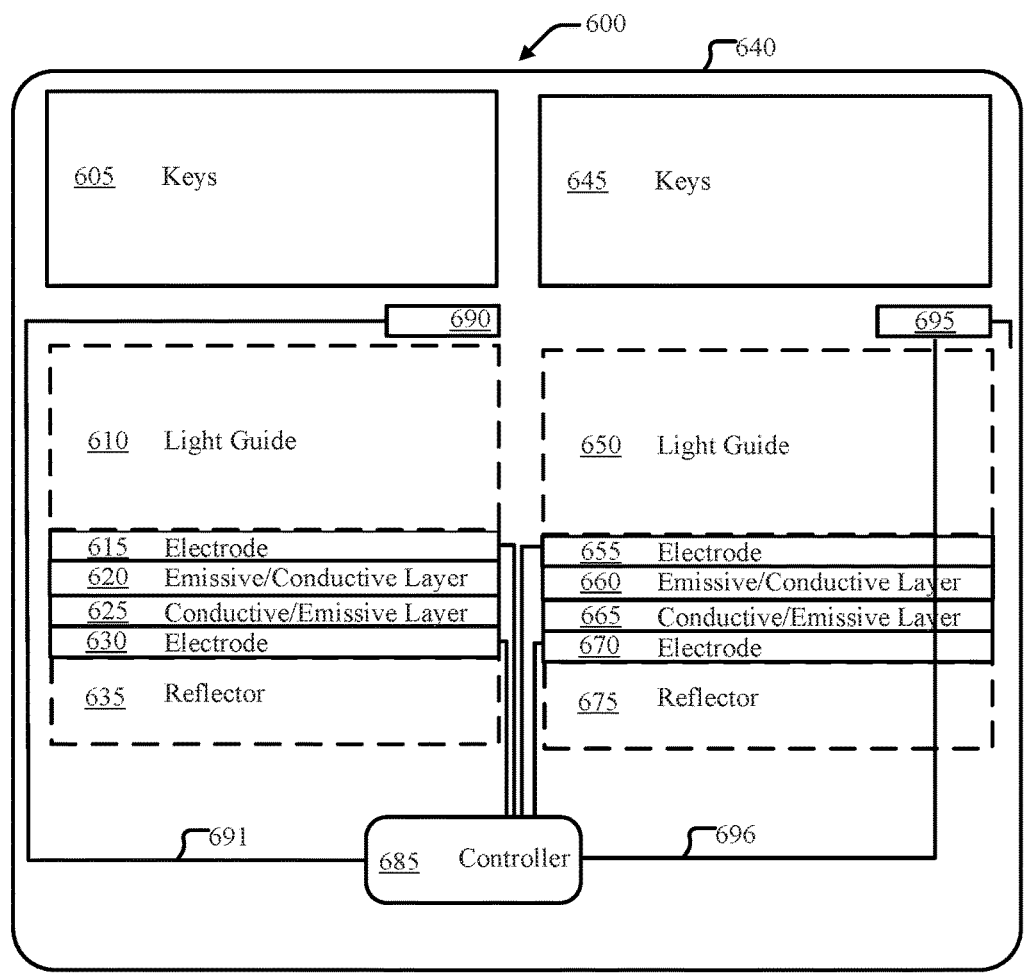
FIG. 6 illustrates a block diagram view of a keyboard stack including a keyboard backlight system having OLED elements according to an embodiment of the present disclosure.

FIG. 6 illustrates a block diagram of keyboard stack system 600. Representative internal components of system 600 provide backlighting according to disclosed embodiments. As shown, system 600 includes keys 605 and 645. Each of these sets of keys is backlit from separate sets of illumination components. Keys 605 and 645 provide input (e.g., mechanical or capacitive input) to switches 690 and 695, which receive the input and convert the input to electrical signals 691 and 696 provided to controller 685. Controller 691 selectively energizes a first and second set of OLEDs. The first and second sets of OLEDs can include one OLED or numerous OLEDs.

In FIG. 6, a first set of OLEDs is represented by electrode 615, emissive/conductive layer 620 (which can be printed as either an emissive or conductive layer in the depicted OLED), conductive/emissive layer 625 (which can be printed as either a conductive or emissive layer in the depicted OLED), and electrode 630. Depending on the configuration of the depicted OLED or set of OLEDs, each of electrodes 615 and 630 is either a cathode or anode. The emissive and conductive layers can be formed of organic molecules or polymers, for example. Similarly, a second OLED or set of OLEDs is represented by electrode 655, emissive/conductive layer 660, conductive/emissive layer 665, and electrode 670.

As shown, keyboard stack system 600 further includes reflector 635, reflector 675, light guide 610, and light guide 650 that may be used in a variety of embodiments. Light guides 610 and 650 may be utilized to establish a 1 to N ratio between the number of OLEDs and number of keys backlit by the OLEDs. As discussed above, light guides 610 and 650 can direct light to individual keys as needed. The first and second OLEDs discussed above may be deposited directly onto light guide 610 or reflector 635. Electrodes 615, 630, 655, or 670 may include a coating (e.g., a transparent coating) to make the OLEDs air stable by sealing the OLED organic material from exposure to air. In another embodiment a seal layer (not shown) may be applied to seal the OLED material from exposure to air and potential degradation.

Figure 7:
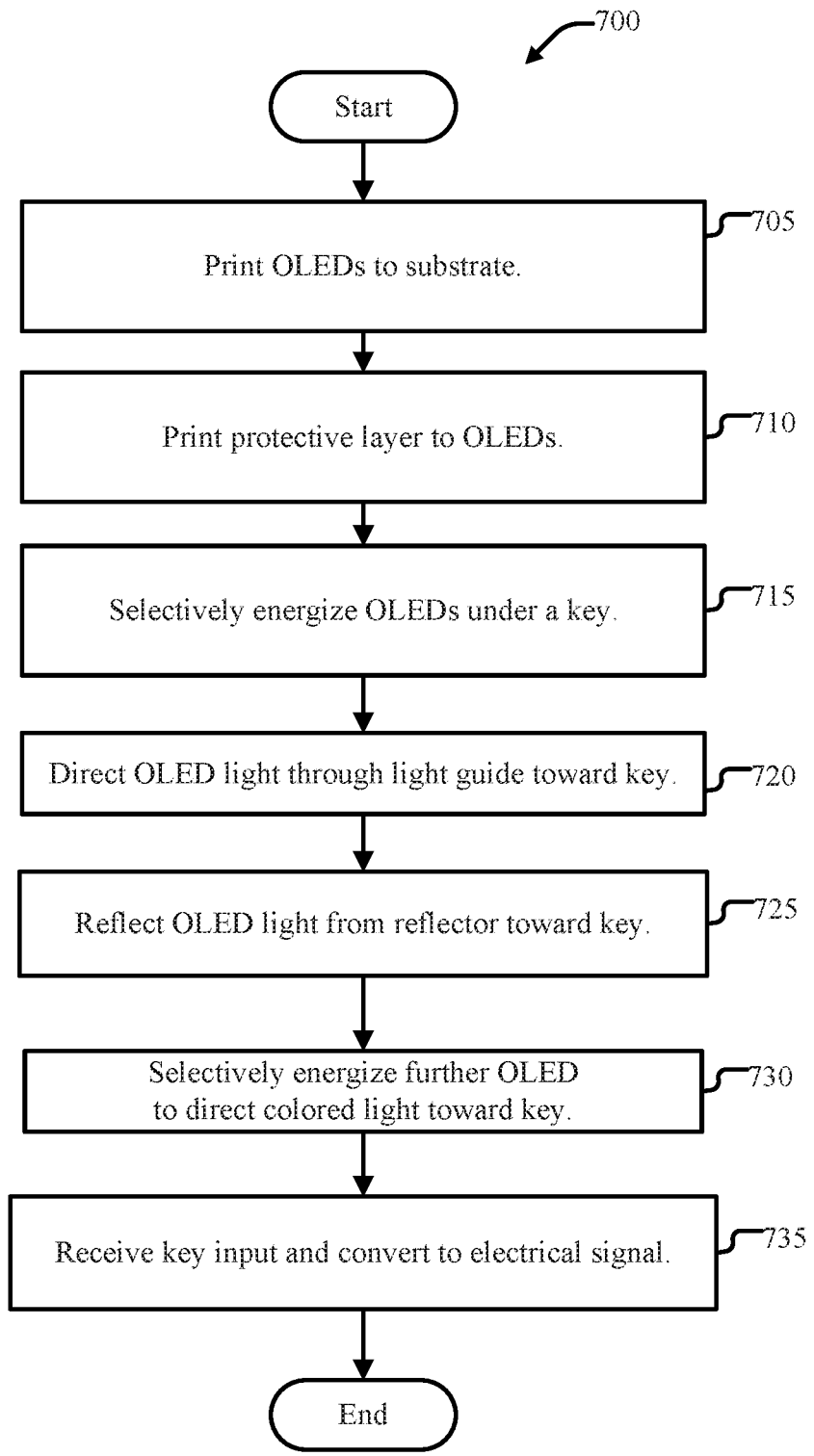
FIG. 7 illustrates a flow diagram with a machine implemented method for lighting a keyboard according to an embodiment of the present disclosure.

FIG. 7 illustrates a flow diagram with a machine-implemented method 700 for keyboard backlighting according to an embodiment of the present disclosure. Block 705 relates to printing OLEDs to a substrate. As examples, the OLEDs can be deposited to a light guide (e.g., light guide 610 in FIG. 6) or reflector (reflector 650 in FIG. 6) in various ways including but not limited to screen printing, vacuum depositing, vacuum thermal evaporation, organic vapor phase deposition, ultrasonic spray, or inkjet printing. Block 710 is relates to printing a seal layer to the OLEDs to contribute to air stability. The protective layer may include electrode components, and may be made of a polymer or polyimide. In block 715, an OLED is energized selectively under a key. Energizing selectively occurs, for example, upon startup, upon detection of low-light conditions, at the request of a program, and the like. To energize the OLED, controller 685 (FIG. 6) turns on the OLED formed by electrode 615, emissive layer 620, conductive layer 625, and electrode 630 by applying a voltage across the electrodes. This causes light to emanate from the OLED.

Block 720 relates to directing the light through a light guide toward a key in some embodiments. For example, in FIG. 6, light is directed through light guide 610 to keys 605. As discussed above, some embodiments include reflectors. Accordingly, block 725 relates to reflecting OLED light toward a key. For example, in FIG. 6, reflector 635 reflects light toward keys 605. Similarly, in FIG. 1, reflective layer 135 reflects light from OLED layer 125 toward one or more keys in key layer 105 in accordance with block 725 (FIG. 7).

Block 730 is related to embodiments which include selectively energizing a further OLED to direct colored light toward the key. Block 730 can be performed by energizing an OLED in OLED layer 130. Controller 685 (FIG. 6) performs block 730 by energizing OLED layer 130 selectively in scenarios including but not limited to: upon boot up of an information handling system; upon a light detector sensing low-light conditions for a keyboard; upon selection of a switch (e.g., through addressing a particular key for illumination); or in response to input from software.

Disclosed embodiments are described herein as including OLED technology; however, such descriptions are intended as non-limiting examples. In addition or instead, disclosed embodiments may employ organic light emitting transistors (OLETs), electroluminescent gel, electroluminescent oxide phosphor, and similar technologies that can be configured in accordance with disclosed embodiments to provide a source of backlighting (e.g., as OLED layer 125, as OLED strip 410, etc.).

In block 735, key input is received and converted to an electrical signal. For example, block 735 is performed when a key in keys 605 (FIG. 6) is depressed to cause switch 690 (FIG. 6) to convert mechanical energy into electrical energy. In some embodiments, a contact within switch 690 closes upon a user depressing a key, causing a voltage signal to transmit to controller 685. Alternatively, switch 690 can be a capacitive switch that changes its capacitance in response to user input. In response, switch 690 sends an electrical signal to controller 685 (FIG. 6) indicating the user input.

Figure 8:
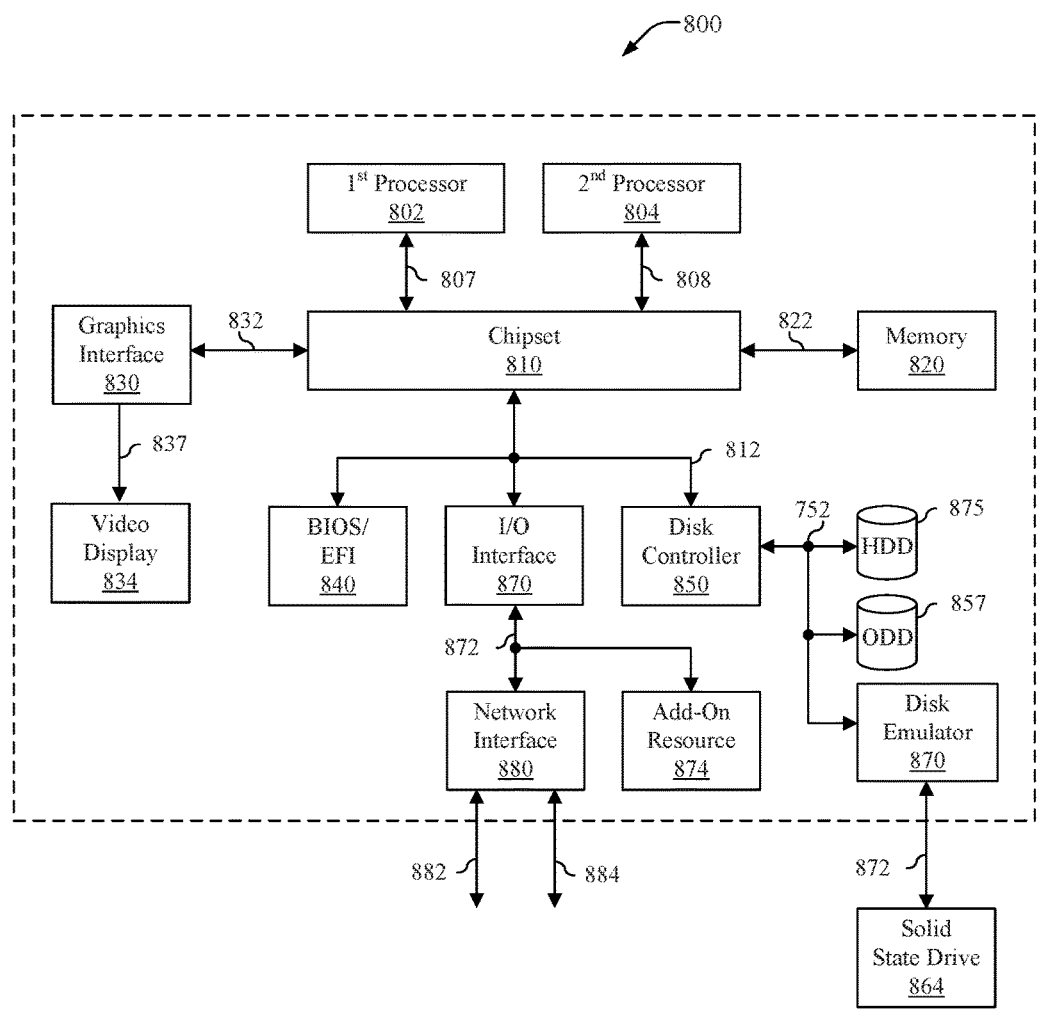
FIG. 8 illustrates a block diagram of an information handling system according to an embodiment of the present disclosure.

FIG. 8 illustrates a block diagram of an information handling system according to an embodiment of the present disclosure. For purpose of this disclosure, an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, the information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, the information handling system can include processing resources for executing machine-executable code, such as CPU 270, a programmable logic array (PLA), an embedded device such as a System-on-a-Chip (SoC), or other control logic hardware. As shown, information handling system 210 includes CPU 270, which could take the form of any such processing resource for executing code. The information handling system can also include one or more buses operable to transmit information between the various hardware components. The information handling system can also include one or more computer-readable medium for storing machine-executable code, such as software or data. Additional components of the information handling system can include one or more storage devices (e.g., memory chips) that can store machine-executable code, one or more communications ports for communicating with external devices, and various input and output (I/O) devices, such as a radio, keyboard, a mouse, and a video display.

FIG. 8 illustrates a generalized embodiment of information handling system 800. Information handling system 800 can include devices or modules that embody one or more of the devices or modules described above, and operates to perform one or more of the methods described above. Information handling system 800 includes a processors 802 and 804, a chipset 810, a memory 820, a graphics interface 830, include a basic input and output system/extensible firmware interface (BIOS/EFI) module 840, a disk controller 850, a disk emulator 860, an input/output (I/O) interface 870, and a network interface 880. Processor 802 is connected to chipset 810 via processor interface 806, and processor 804 is connected to chipset 810 via processor interface 808. Memory 820 is connected to chipset 810 via a memory bus 822. Graphics interface 830 is connected to chipset 810 via a graphics interface 832, and provides a video display output 836 to a video display 834. In a particular embodiment, information handling system 800 includes separate memories that are dedicated to each of processors 802 and 804 via separate memory interfaces. An example of memory 820 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 840, disk controller 850, and I/O interface 870 are connected to chipset 810 via an I/O channel 812. An example of I/O channel 812 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 810 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 840 includes BIOS/EFI code operable to detect resources within information handling system 800, to provide drivers for the resources, initialize the, and access the resources. BIOS/EFI module 840 includes code that operates to detect resources within information handling system 800, to provide drivers for the resources, to initialize the resources, and to access the resources.

Disk controller 850 includes a disk interface 852 that connects the disc controller to a hard disk drive (HDD) 854, to an optical disk drive (ODD) 856, and to disk emulator 860. An example of disk interface 852 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 860 permits a solid-state drive 864 to be connected to information handling system 800 via an external interface 862. An example of external interface 862 includes a USB interface, an IEEE 7194 (Firewire) interface, a proprietary interface, or a combination thereof. Alternatively, solid-state drive 864 can be disposed within information handling system 800.

I/O interface 870 includes a peripheral interface 872 that connects the I/O interface to an add-on resource 874 and to network interface 880. Peripheral interface 872 can be the same type of interface as I/O channel 812, or can be a different type of interface. As such, I/O interface 870 extends the capacity of I/O channel 812 when peripheral interface 872 and the I/O channel are of the same type, and the I/O interface translates information from a format suitable to the I/O channel to a format suitable to the peripheral channel 872 when they are of a different type. Add-on resource 874 can include a data storage system, an additional graphics interface, a network interface card (NIC), a sound/video processing card, another add-on resource, or a combination thereof. Add-on resource 874 can be on a main circuit board, on separate circuit board or add-in card disposed within information handling system 800, a device that is external to the information handling system, or a combination thereof.

Network interface 880 represents a NIC disposed within information handling system 800, on a main circuit board of the information handling system, integrated onto another component such as chipset 810, in another suitable location, or a combination thereof. Network interface device 880 includes network channels 882 and 884 that provide interfaces to devices that are external to information handling system 800. In a particular embodiment, network channels 882 and 884 are of a different type than peripheral channel 872 and network interface 880 translates information from a format suitable to the peripheral channel to a format suitable to external devices. An example of network channels 882 and 884 includes InfiniBand channels, Fibre Channel channels, Gigabit Ethernet channels, proprietary channel architectures, or a combination thereof. Network channels 882 and 884 can be connected to external network resources (not illustrated). The network resource can include another information handling system, a data storage system, another network, a grid management system, another suitable resource, or a combination thereof.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method for illuminating a keyboard, the method comprising:
   selectively energizing a first organic light emitting diode in response to boot-up of an information handling system, wherein the first organic light emitting diode is:
      printed to a substrate that is a reflector layer or a light guide layer of a keyboard stack;
      positioned under a first key layer of the keyboard stack; and
      configured to primarily illuminate the first key when selectively energized.

2. The method of claim 1, wherein the substrate comprises a reflector layer that is made of a light reflective material.

3. The method of claim 1, further comprising:
   selectively energizing a second organic light emitting diode arranged substantially above the first organic light emitting diode after boot-up is complete.

4. The method of claim 3, wherein selectively energizing the second organic light emitting diode results in emitting substantially white light for the key, wherein selectively energizing the first organic light emitting diode results in emitting colored light for the key.

5. The method of claim 1, further comprising:
   selectively energizing a second organic light emitting diode arranged substantially beneath the first organic light emitting diode after boot-up is complete.

6. The method of claim 5, wherein selectively energizing the second organic light emitting diode results in emitting substantially white light for the key, wherein selectively energizing the first organic light emitting diode results in emitting colored light for the key.

7. The method of claim 5, further comprising:
   directing light from the first organic light emitting diode through a first light guide to a first set of keys; and
   directing light from the second organic light emitting diode through a second light guide to a second set of keys.

8. A keyboard apparatus comprising:
   a key layer comprising keys for receiving user input;
   a switch layer comprising transducers for converting the user input to electrical signals;
   a first organic light emitting diode layer printed to a light guide layer comprising a first set of organic light emitting diodes for providing light for the key layer;
   the light guide layer including at least one light guide for directing light from the first organic light emitting layer toward the key layer; and
   a controller selectively energizing the first organic light emitting diode layer.

9. The keyboard apparatus of claim 8, wherein the first organic light emitting diode layer further comprises:
   a seal layer arranged to prevent exposure to air by the organic light emitting diodes.

10. The keyboard apparatus of claim 8, wherein the first organic light emitting diode layer is for providing substantially white light for the key layer, the keyboard apparatus further comprising:
    a second organic light emitting layer comprising a second set of organic light emitting diodes for providing colored light for the key layer.

11. The keyboard apparatus of claim 8, further comprising:
    a second organic light emitting layer comprising a second set of organic light emitting diodes for providing substantially white light for the key layer; and
    the controller selectively energizing the second set of organic light emitting diodes in response to a sensor detecting low-light conditions.

12. The keyboard apparatus of claim 10, wherein the second set of organic light emitting diodes are printed to the light guide layer.

13. The keyboard apparatus of claim 8, wherein the controller selectively energizes the first organic light emitting diode layer in response to input from a software application.

14. The keyboard apparatus of claim 8, further comprising:
    a reflective layer comprising at least one reflector for directing light from the first organic light emitting diode layer toward the key layer.

15. An apparatus comprising:
    a first set of keys;
    a first organic light emitting diode comprising a substantially transparent electrode layer, wherein the first organic light emitting diode is arranged to provide substantially white light through a first portion of the set of keys;
    a reflector layer substrate for directing light to the first portion of the set of keys, wherein the first organic light emitting diode is printed on the reflector layer substrate and positioned under the first portion of the set of keys; and
    a controller selectively energizing the first organic light emitting diode.

16. The apparatus of claim 15, further comprising:
    a second organic light emitting diode comprising a second substantially transparent electrode layer, wherein the second organic light emitting diode is arranged to provide substantially white light through a second portion of the set of keys.

17. The apparatus of claim 16, further comprising:
    the controller selectively energizing the first organic light emitting diode in response to boot up of an information handling system; and
    the controller selectively energizing the second organic light emitting diode in response to completion of the boot up of the information handling system.

18. The apparatus of claim 15, further comprising:
    the controller selectively energizing the first organic light emitting diode in response to selection of a switch.

19. The apparatus of claim 16, further comprising:
    the controller selectively energizing the first organic light emitting diode in response to a sensor detecting low-light conditions at a first level; and
    the controller selectively energizing the second organic light emitting diode in response to a sensor detecting low-light conditions at a second level.

20. The apparatus of claim 15, further comprising:
    the controller selectively energizing the first organic light emitting diode in response to input from software detecting proximity of a user.

* * * * *

UNITED STATES PATENT AND TRADEMARK OFFICE
CERTIFICATE OF CORRECTION

PATENT NO. : 9,959,995 B2  
APPLICATION NO. : 15/052440  
DATED : May 1, 2018  
INVENTOR(S) : Andrew P. Tosh et al.

Page 1 of 1

It is certified that error appears in the above-identified patent and that said Letters Patent is hereby corrected as shown below:

In the Claims

In Claim 15, Line 10, replace "the" with "a".

Signed and Sealed this
Nineteenth Day of June, 2018

Andrei Iancu
*Director of the United States Patent and Trademark Office*